(12) United States Patent
Shi

(10) Patent No.: US 10,564,755 B2
(45) Date of Patent: Feb. 18, 2020

(54) FLEXIBLE TOUCH PANEL, MANUFACTURING METHOD THEREOF, AND TOUCH DEVICE WITH THE SAME

(71) Applicant: Wuhan China Star Optoelectronics Semiconductor Display Technology Co., Ltd., Wuhan, Hubei (CN)

(72) Inventor: Wenjie Shi, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 50 days.

(21) Appl. No.: 16/100,798

(22) Filed: Aug. 10, 2018

(65) Prior Publication Data
US 2019/0087041 A1  Mar. 21, 2019

Related U.S. Application Data

(63) Continuation of application No. PCT/CN2018/071588, filed on Jan. 5, 2018.

(30) Foreign Application Priority Data

Sep. 19, 2017  (CN) .......................... 2017 1 0852055

(51) Int. Cl.
*G09G 3/30* (2006.01)
*G06F 3/044* (2006.01)
(Continued)

(52) U.S. Cl.
CPC ............ *G06F 3/0412* (2013.01); *G06F 3/044* (2013.01); *H01L 27/323* (2013.01); *H01L 51/0097* (2013.01); *H01L 51/56* (2013.01); *G06F 3/0445* (2019.05); *G06F 2203/04102* (2013.01); *G06F 2203/04103* (2013.01); *G06F 2203/04107* (2013.01); *H01L 2251/5338* (2013.01)

(58) Field of Classification Search
CPC .... G06F 2203/04107; G06F 1/18–206; G09G 3/30–3291
See application file for complete search history.

(56) References Cited

U.S. PATENT DOCUMENTS

2018/0203555 A1* 7/2018 Miyamoto .............. G06F 3/044
2018/0348931 A1* 12/2018 Kim ....................... G06F 3/0412

* cited by examiner

*Primary Examiner* — Sanghyuk Park
(74) *Attorney, Agent, or Firm* — Hemisphere Law, PLLC; Zhigang Ma

(57) ABSTRACT

A flexible touch panel located on an OLED substrate is provided. The flexible touch panel includes a conductive layer, a first insulation layer, a first electrode layer, a second insulation layer, a second electrode layer, and a protection layer disposed in a serial. The conductive layer is disposed on a packaging layer of the OLED substrate. The first insulation layer and the first electrode layer are stacked on the conductive layer. The first electrode layer, the second insulation layer, and the second electrode layer form a capacitor structure for sensing a touch signal. The conductive layer is utilized for inputting a first voltage signal. The first voltage signal has the conductive layer expelling electric field lines generated by the first electrode layer to shield signal interference between the first electrode layer and a cathode layer of the OLED substrate. A manufacturing method thereof and a touch device are also provided.

16 Claims, 3 Drawing Sheets

(51) Int. Cl.
*G06F 3/041* (2006.01)
*H01L 51/00* (2006.01)
*H01L 27/32* (2006.01)
*H01L 51/56* (2006.01)

FLEXIBLE TOUCH PANEL, MANUFACTURING METHOD THEREOF, AND TOUCH DEVICE WITH THE SAME

RELATED APPLICATIONS

This application is a continuation application of PCT Patent Application No. PCT/CN2018/071588, filed Jan. 5, 2018, and claims the priority of China Application No. 201710852055.9, filed Sep. 19, 2017, which is herein incorporated by reference in its entirety.

FIELD OF THE DISCLOSURE

The present invention is related to touch control technology, and more particularly is related to a flexible touch panel, a manufacturing method thereof, and a touch device with the same.

BACKGROUND

Attending with the progress of display technology, organic light-emitting diode (OLED) has be used by more and more electronic products, and the flexible OLED touch panel with the characteristic of flexibility has attracted the attention. Most of the flexible OLED touch panel uses the external touch sensor, i.e. the touch sensor module is completed on the substrate first and then adhered to the OLED substrate. However, the external touch sensor would cause negative influence to the development of small size and flexible display modules.

The in-cell touch technology is to incorporate the touch sensor in the flexible OLED touch panel. In present, a major problem of forming the touch sensor on the flexible OLED touch panel directly is the relatively large interference from the electron emitting layer (i.e. the cathode) of the OLED to the touch sensor signals. Because the thin film packaging material only has a thickness of 10 to 20 microns, the touch sensor would be close to the cathode and the electric field of the cathode would influence the driving signals of the touch sensor to cause the reduction of data generated at the node, such that the signal change when being touched would be less significant, and thus results in the difficulty to sense the touch signal by using the touch sensor.

SUMMARY

A flexible touch panel, a manufacturing method thereof, and a touch device with the same are provided in the present application for shielding the signal interference from the electric field of the cathode in the flexible touch panel to the touch sensor.

A flexible touch panel is provided in the present application. The flexible touch panel is located on an OLED substrate. The flexible touch panel includes a conductive layer, a first insulation layer, a first electrode layer, a second insulation layer, a second electrode layer, and a protection layer disposed in a serial, the conductive layer is disposed on a packaging layer of the OLED substrate, the first insulation layer and the first electrode layer are stacked on the conductive layer, the first electrode layer, the second insulation layer, and the second electrode layer form a capacitor structure for sensing a touch signal, the protection layer is utilized for covering the second electrode layer, the conductive layer is utilized for inputting a first voltage signal, and the first voltage signal is utilized to have the conductive layer expelling electric field lines generated by the first electrode layer so as to shield signal interference between the first electrode layer and a cathode layer of the OLED substrate.

In an embodiment, the conductive layer is bendable to conform flexibility of the flexible touch panel.

In an embodiment, the conductive layer is selected from a group composed of conductive polymer materials, carbon nanotubes, graphene, silver nanowires, metal mesh, and a combination thereof.

In an embodiment, a projection area of the conductive layer on the second electrode layer overlaps a projection area of the first electrode layer on the second electrode layer.

In an embodiment, the flexible touch panel further comprises a chip, the chip includes a first signal end for inputting the first voltage signal, and the conductive layer is electrically connected to the first signal end.

In an embodiment, the chip further includes a second signal end, the first electrode layer is electrically connected to the second signal end, the second signal end is utilized for inputting the second voltage signal, a value of the first voltage signal is greater than 0 and is smaller than or equal to a value of the second voltage signal.

In an embodiment, the flexible touch panel further comprises a non-touch area without touch control capability, the conductive layer includes a first bonding area, the first bonding area is in the non-touch area, and the first bonding area is electrically connected to the first signal end.

A manufacturing method of a flexible touch panel is also provided in the present application, which comprises: providing an OLED substrate, which includes a cathode layer and a packaging layer stacked thereon; forming a conductive layer on the packaging layer; forming a first insulation layer on the conductive layer, and patterning the first insulation layer to expose a first bonding area of the conductive layer; forming a first electrode layer on the first insulation layer, forming a second insulation layer on the first electrode layer, and patterning the first electrode layer and the second insulation layer to expose the first bonding area; forming a second electrode layer on the second insulation layer, forming a protection layer on the second electrode layer, and patterning the second electrode layer and the protection layer to expose the first bonding area; and inputting a first voltage signal in the first bonding area, wherein the first voltage signal has the conductive layer generating an electric field to shield signal interference between the cathode layer and the first electrode layer.

In an embodiment, the manufacturing method further comprises: patterning the first electrode layer to form a second bonding area of the first electrode layer; patterning the second insulation layer to expose the second bonding area; patterning the second electrode layer to expose the second bonding area; patterning the protection layer to expose the second bonding area; and inputting a second voltage signal in the second bonding area, wherein a value of the first voltage signal is greater than 0 and is smaller than or equal to a value of the second voltage signal.

A touch device is also provided in the present application. The touch device comprises a flexible touch panel, which is located on an OLED substrate. The flexible touch panel includes a conductive layer, a first insulation layer, a first electrode layer, a second insulation layer, a second electrode layer, and a protection layer disposed in a serial, the conductive layer is disposed on a packaging layer of the OLED substrate, the first insulation layer and the first electrode layer are stacked on the conductive layer, the first electrode, the second insulation layer, and the second electrode layer form a capacitor structure for sensing a touch signal, the protection layer is utilized for covering the second electrode layer, the conductive layer is utilized for inputting a first voltage signal, and the first voltage signal is utilized to have the conductive layer expelling electric field lines generated by the first electrode layer so as to shield signal interference between the first electrode layer and a cathode layer of the OLED substrate.

Regarding the touch device provided in the present application, which includes the flexible touch panel, by placing the conductive layer between the cathode layer and the first electrode layer and applying a first voltage signal to the conductive layer, the electric field generated between the conductive layer and the first electrode layer may expel the electric field lines of the first electrode layer toward the second electrode layer because both the first voltage signal and the driving signal of the first electrode layer are positive voltage signals. Thereby, the electric fields of the cathode layer and the first electrode layer would not interfere with each other, i.e. the influence resulted from the electric field of the cathode layer to the capacitor structure composed of the first electrode layer and the second electrode layer would be shielded. In addition, the electric field generated between the conductive layer and the first electrode layer may push the electric field lines of the first electrode layer toward the second electrode layer to magnify the signal variation between the first electrode layer and the second electrode layer such that the sensitivity of the touch control layer to sense the touch signal can be enhanced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts.

DETAILED DESCRIPTION OF PREFERRED EMBODIMENTS

In order to understand the above objectives, features and advantages of the present disclosure more clearly, the present disclosure is described in detail below with references to the accompanying drawings and specific embodiments.

Figure 1:
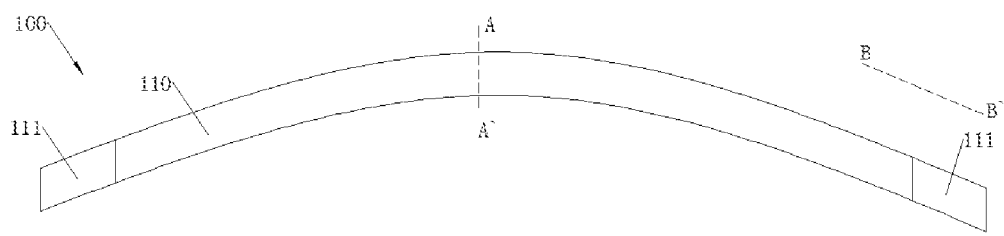
FIG. 1 is a structural schematic view of a flexible touch panel provided in accordance with an embodiment of the present invention.

Please refer to FIG. 1, a touch device 100 is provided in an embodiment of the present invention. The touch device 100 includes a flexible touch panel 200 and an OLED substrate 300. The flexible touch panel 200 is disposed on an OLED substrate 300. The touch device 100 includes a display area 110 and a non-display area 111. The display area 110 is utilized for sensing the touch, and the non-display area 111 is located around the display area 110 for placing the chip, the connection wires, the bonding pads, etc. The display area 110 includes a flexible substrate 112, a packaging layer 113 on the flexible substrate 112, a touch control layer 114 on the packaging layer 113, and a flexible cover 115. The display area 110 is bendable such that it can be applied to the flexible and bendable touch screens.

Figure 2:
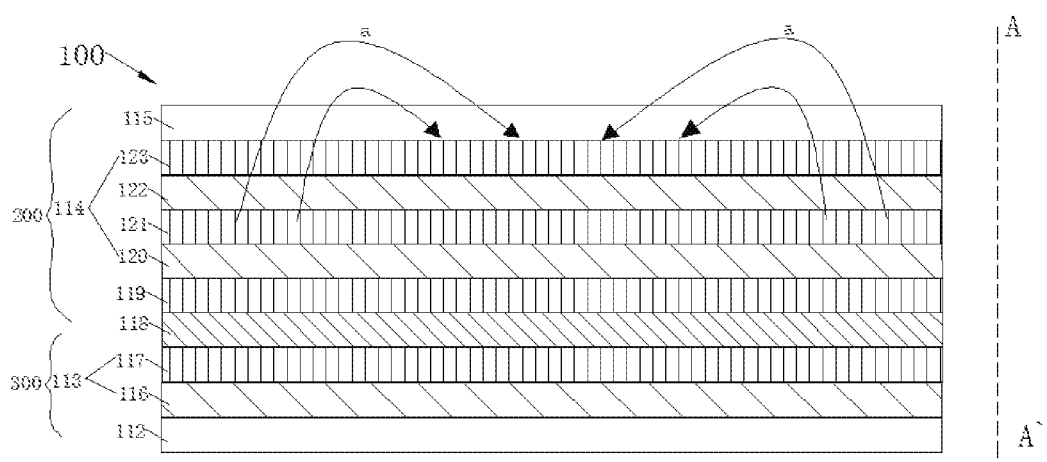
FIG. 2 is a cross-sectional schematic view along AA' cross-section of FIG. 1.

Please refer to FIG. 2, the flexible cover 115 is placed on the flexible substrate 112 and joined together by using a glue layer respectively to have the packaging layer 113 and the touch control layer 114 confined between the flexible cover 115 and the flexible substrate 112.

The flexible touch panel 200 is provided in an embodiment of the present invention. The flexible touch panel 200 is located on the OLED substrate 300. The flexible touch panel 200 includes a conductive layer 118, a first insulation layer 119, a first electrode layer 120, a second insulation layer 121, a second electrode layer 122, and a protection layer 123 disposed in a serial. The conductive layer 118 is disposed on the packaging layer 113 of the OLED substrate 300. The first insulation layer 119 and the first electrode layer 120 are stacked on the conductive layer 118 in a serial. The first insulation layer 119 is utilized for insulating the first electrode layer 120 from the conductive layer 118. The first electrode layer 120, the second insulation layer 121, and the second electrode layer 122 compose a capacitor structure for sensing a touch signal. The first insulation layer 119 is utilized for insulating the first electrode layer 120 from the conductive layer 118. The protection layer 123 is utilized for covering the second electrode layer 122, and the packaging layer 117 is utilized for insulating the cathode layer 116 from the conductive layer 118.

The first electrode layer 120 and the second electrode layer 122 are connected to an external power source and an external signal line. The first electrode layer 120, the insulation layer 121 and the second electrode layer 122 compose the capacitor structure to generate a constant electric field, which is corresponding to the capacitance of the capacitor structure. When a conductive object or a finger touches the flexible cover 115, the electric field distribution would be changed such that the capacitance of the capacitor structure would be changed accordingly. By sensing the change of capacitance through the external signal line, the determination of the touch position can be implemented.

In the conventional art, because the packaging layer 119 is located between the cathode layer 116 and the first electrode layer 120 and the thickness of the packaging layer 119 is small, typically ranged between 10 to 20 microns, such that the cathode layer 116 would be close to the first electrode layer 120 and the electric field of the cathode layer 116 may influence the driving signal generated on the first electrode layer 120 to weaken the distribution of electric field lines of the capacitor structure, such that the signal change when being touched would be less significant, and make it difficult to sense the touch signal by using the second electrode layer 122.

In the present embodiment, by placing the conductive layer 118 between the cathode layer 116 and the first electrode layer 120 and applying a first voltage signal V1 to the conductive layer 118, the electric field generated between the conductive layer 118 and the first electrode layer 120 may expel the electric field lines a of the first electrode layer 120 toward the second electrode layer 122 because both the first voltage signal V1 and the driving signal of the first electrode layer 120 are positive voltage signals. Thereby, the electric fields of the cathode layer 116 and the first electrode layer 120 would not interfere with each other, i.e. the influence caused by the electric field of the cathode layer 116 to the capacitor structure composed of the first electrode layer 120 and the second electrode layer 122 would be shielded. In addition, the electric field generated between the conductive layer 118 and the first electrode layer 120 may push the electric field lines a of the first electrode layer 120 toward the second electrode layer 122 to magnify the signal variation between the first electrode layer 120 and the second electrode layer 122 such that the sensitivity to sense the touch signal by using the second electrode layer 122 can be enhanced.

One of the applications provided in the present invention is the touch panel suitable for the flexible OLED substrate. That is, the function layers thereof have the characteristics such as bendable, good flexibility, etc. Accordingly, the conventional materials for forming the conductive layer 118 with the function of electrostatic shielding, such as Indium Tin Oxide (ITO), Indium Zinc Oxide (IZO), and aluminum-doped zinc oxide (AZO), may not be suitable to be used to resolve the problem of the present application because these materials have a greater hardness, a high fragility, and are difficult to be bended or may generate cracks during bending.

In the present embodiment, the conductive layer 118 is bendable to conform flexibility of the OLED substrate 300.

Concretely speaking, the conductive layer 118 can be selected from the group composed of conductive polymer materials, carbon nanotubes, graphene, silver nanowires, metal mesh, and a combination thereof. The conductive layer 118 can also be a mixture of conductive particles and flexible organic material.

Optionally, the flexible touch panel 200 further includes an illuminating layer. The illuminating layer is stacked on the touch control layer 114. The first electrode layer 120, the second insulation layer 121, the second electrode layer 122, and the protection layer 123 are all transparent to have the light beam passing through. Concretely speaking, the first electrode layer 120 and the second electrode layer 122 can made of the transparent conductive materials such as carbon nanotubes, graphene, conductive polymer materials, silver nanowires, metal mesh, etc. The metal mesh can be the mesh structure made of the metal selected from Ti, Al, Mo, Ag, etc., or the alloy by etching. The second insulation layer 121 and the protection layer 123 can be made of the inorganic materials such as $SiO_2$ and $SiN_x$, or an organic materialsuch as a dielectric overcoat.

Optionally, the conductive layer 118 and the first insulation layer 119 are also transparent. Concretely speaking, the conductive layer 118 can made of the transparent conductive materials such as carbon nanotubes, graphene, conductive polymer materials, silver nanowires, metal mesh, etc. The metal mesh can be the mesh structure made of the metal selected from Ti, Al, Mo, Ag, etc., or the alloy by etching. The first insulation layer 119 can be made of the inorganic materials such as $SiO_2$ and $SiN_x$, or an organic insulation materialsuch as a dielectric overcoat.

Optionally, the conductive layer 118 can be a whole layer conductive structure without patterning, or a patterned conductive structure.

Figure 3:
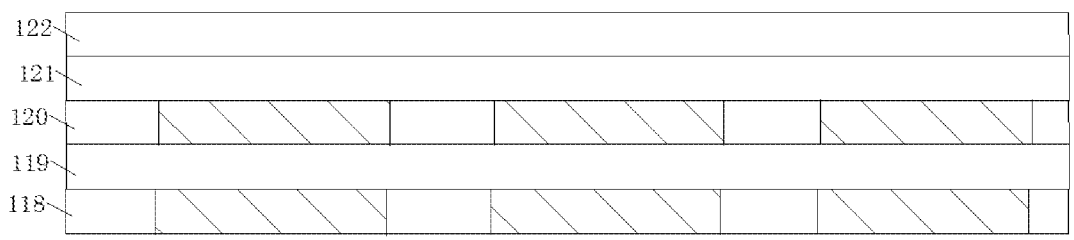
FIG. 3 is a partial enlarged view of FIG. 2.

Optionally, please refer to FIG. 3, as the conductive layer 118 is a patterned structure, the projection area of the conductive layer 118 on the second electrode layer 122 would overlap the projection area of the first electrode layer 120 on the second electrode layer 122. Such design is capable to enhance transmittance of the conductive layer 118 in addition to shielding the interference caused by the cathode layer 116 to the signals of the first electrode layer 120.

Optionally, the flexible touch panel 200 further comprises a chip 126. The chip 126 has a first signal end 127. The first signal end 127 is utilized for inputting the first voltage signal V1. The conductive layer 118 is electrically connected to the first signal end 127.

Optionally, the chip 126 also includes a second signal end 128. The first electrode layer 120 is electrically connected to the second signal end 128. The second signal end 128 is utilized for inputting the second voltage signal V2.

Optionally, the value of the first voltage signal V1 is greater than 0, and is smaller than or equal to the value of the second voltage signal V2.

Figure 4:
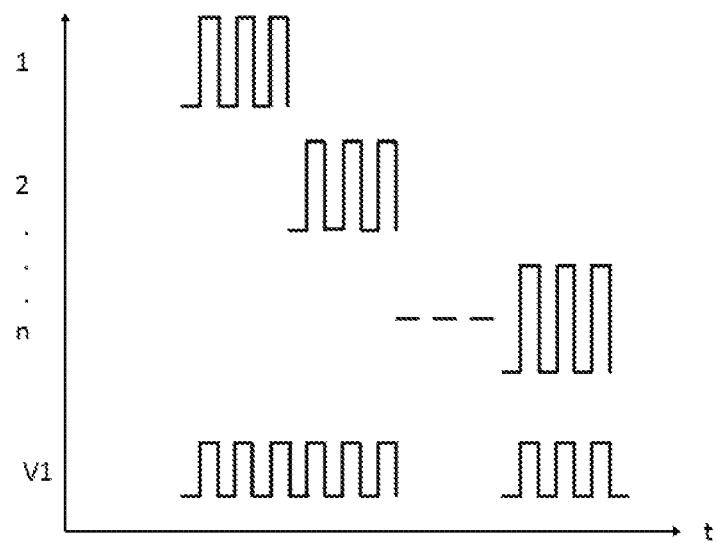
FIG. 4 is a schematic view showing a voltage signal inputted to the first electrode layer and the conductive layer in accordance with an embodiment of the present invention.
Figure 5:
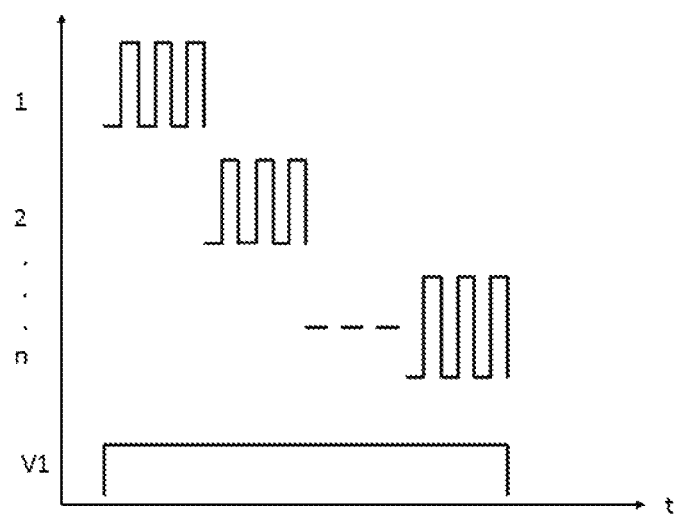
FIG. 5 is a schematic view showing another voltage signal inputted to the first electrode layer and the conductive layer in accordance with an embodiment of the present invention.

Optionally, please refer to FIG. 4 and FIG. 5, the first voltage signal V1 can be a changing voltage signal or a constant voltage signal. When the first voltage signal V1 changes, the first voltage signal V1 and the second voltage signal V2 of the first electrode layer 120 are kept synchronized. The numbers 1, 2 . . . n in the figures represent the voltage signals of the first electrode layer 120at different timings, and V1 represent the first voltage signal.

Figure 6:
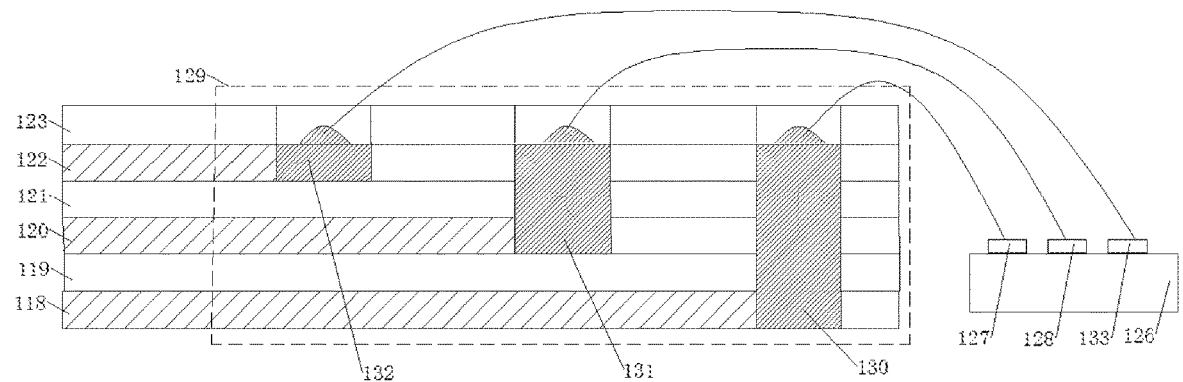
FIG. 6 is a structural schematic view of a flexible touch panel provided in accordance with an embodiment of the present invention.

Optionally, please refer to FIG. 6, the OLED substrate 300 further includes a non-touch area 129. The non-touch area 129 is provided without touch control capability. The non-touch area 129 may be located in the non-display area 111. The conductive layer 118 includes a first bonding area 130. The first electrode layer 120 includes a second bonding area 131. The second electrode layer 122 includes a third bonding area 132. The first bonding area 130, the second bonding area 131, and the third bonding area 132 are all located in the non-touch area 129. The first bonding area 130 is electrically connected to the first signal end 127 to have the conductive layer 118 electrically connected to the first signal end 127. The second bonding area 131 is electrically connected to the second signal end 128 to have the first electrode layer 120 electrically connected to the second signal end 128. The chip 126 also has a third signal end 133. The third bonding area 132 is electrically connected to the third signal end 133 to have the second electrode layer 122 electrically connected to the third signal end 133 for sensing the touch signal.

Figure 7:
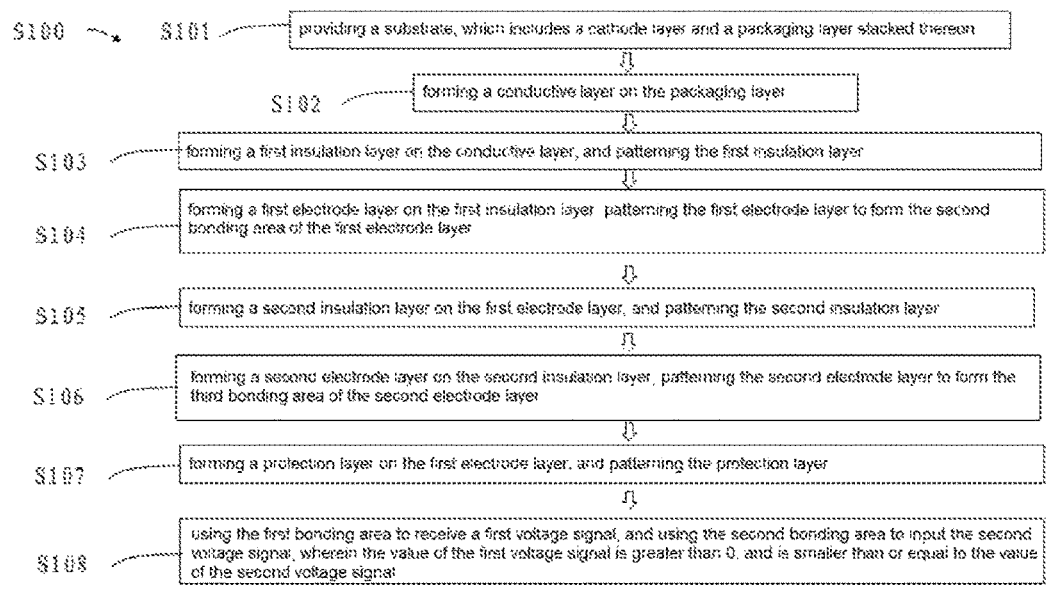
FIG. 7 is a flow chart showing the manufacturing method of the flexible touch panel provided in accordance with an embodiment of the present invention.

Please refer to FIG. 6 and FIG. 7, a manufacturing method S100 of a flexible touch panel is provided for manufacturing the flexible touch panel 200 mentioned above. Specifically, the manufacturing method comprises the following steps.

S101 is of providing an OLED substrate 300, which includes a cathode layer 116 and a packaging layer 117 stacked thereon.

S102 is of forming a conductive layer 118 on the packaging layer 117.

S103 is of forming a first insulation layer 119 on the conductive layer 118, and patterning the first insulation layer 119 to expose a first bonding area 130 of the conductive layer 118.

S104 is of forming a first electrode layer 120 on the first insulation layer 119, and patterning the first electrode layer 120 to form the driving electrode and the second bonding area 131 and to expose the first bonding area 130.

S105 is of forming a second insulation layer 121 on the first electrode layer 120, and patterning the second insulation layer 121 to expose the first bonding area 130 and the second bonding area 131.

S106 is of forming a second electrode layer 122 on the second insulation layer 121, and patterning the second electrode layer 122 to form the sensing electrode and the third bonding area 132 of the second electrode layer 122.

S107 is of forming a protection layer 123 on the second electrode layer 122, and patterning the protection layer 123 to expose the first bonding area 130, the second bonding area 131, and the third bonding area 132.

S108 is of using the first bonding area 130 to receive a first voltage signal V1, wherein the first voltage signal V1 would have the conductive layer 118 generating an electric field to reduce signal interference between the cathode layer 116 and the first electrode layer 120. S108 is also of using the second bonding area to input the second voltage signal V2, wherein the value of the first voltage signal V1 is greater than 0, and is smaller than or equal to the value of the second voltage signal. S108 is also of using the third bonding area 133 to receive the signal received by the sensing electrode for sensing the touch.

The foregoing contents are detailed description of the disclosure in conjunction with specific preferred embodiments and concrete embodiments of the disclosure are not limited to the description. For the person skilled in the art of the disclosure, without departing from the concept of the disclosure, simple deductions or substitutions can be made and should be included in the protection scope of the application.

What is claimed is:

1. A flexible touch panel, located on an OLED substrate, wherein the flexible touch panel includes a conductive layer, a first insulation layer, a first electrode layer, a second insulation layer, a second electrode layer, and a protection layer disposed in a serial, the conductive layer is disposed on a packaging layer of the OLED substrate, the first insulation layer and the first electrode layer are stacked on the conductive layer, the first electrode layer, the second insulation layer, and the second electrode layer form a capacitor structure for sensing a touch signal, the protection layer is utilized for covering the second electrode layer, the conductive layer is utilized for inputting a first voltage signal, and the first voltage signal is utilized to have the conductive layer expelling electric field lines generated by the first electrode layer to shield signal interference between the first electrode layer and a cathode layer of the OLED substrate.

2. The flexible touch panel of claim 1, wherein the conductive layer is bendable to conform flexibility of the flexible touch panel.

3. The flexible touch panel of claim 2, wherein the conductive layer is selected from a group composed of conductive polymer materials, carbon nanotubes, graphene, silver nanowires, metal mesh, and a combination thereof.

4. The flexible touch panel of claim 3, wherein a projection area of the conductive layer on the second electrode layer overlaps a projection area of the first electrode layer on the second electrode layer.

5. The flexible touch panel of claim 1, wherein the flexible touch panel further comprises a chip, the chip includes a first signal end for inputting the first voltage signal, and the conductive layer is electrically connected to the first signal end.

6. The flexible touch panel of claim 5, wherein the chip further includes a second signal end, the first electrode layer is electrically connected to the second signal end, the second signal end is utilized for inputting a second voltage signal, and a value of the first voltage signal is greater than 0 and is smaller than or equal to a value of the second voltage signal.

7. The flexible touch panel of claim 6, wherein the flexible touch panel further comprises a non-touch area without touch control capability, the conductive layer includes a first bonding area, the first bonding area is in the non-touch area, and the first bonding area is electrically connected to the first signal end.

8. A manufacturing method of a flexible touch panel, comprising:
   providing an OLED substrate, which includes a cathode layer and a packaging layer stacked thereon;
   forming a conductive layer on the packaging layer;
   forming a first insulation layer on the conductive layer, and patterning the first insulation layer to expose a first bonding area of the conductive layer;
   forming a first electrode layer on the first insulation layer, forming a second insulation layer on the first electrode layer, and patterning the first electrode layer and the second insulation layer to expose the first bonding area;
   forming a second electrode layer on the second insulation layer, forming a protection layer on the second electrode layer, and patterning the second electrode layer and the protection layer to expose the first bonding area; and
   inputting a first voltage signal in the first bonding area, wherein the first voltage signal has the conductive layer generating an electric field to shield signal interference between the cathode layer and the first electrode layer.

9. The manufacturing method of claim 8, further comprising:
   patterning the first electrode layer to form a second bonding area of the first electrode layer;
   patterning the second insulation layer to expose the second bonding area;
   patterning the second electrode layer to expose the second bonding area;
   patterning the protection layer to expose the second bonding area; and
   inputting a second voltage signal in the second bonding area, wherein a value of the first voltage signal is greater than 0 and is smaller than or equal to a value of the second voltage signal.

10. A touch device, comprising a flexible touch panel, located on an OLED substrate, wherein the flexible touch panel includes a conductive layer, a first insulation layer, a first electrode layer, a second insulation layer, a second electrode layer, and a protection layer disposed in a serial, the conductive layer is disposed on a packaging layer of the OLED substrate, the first insulation layer and the first electrode layer are stacked on the conductive layer, the first electrode, the second insulation layer, and the second electrode layer form a capacitor structure for sensing a touch signal, the protection layer is utilized for covering the second electrode layer, the conductive layer is utilized for inputting a first voltage signal, and the first voltage signal is utilized to have the conductive layer expelling electric field lines generated by the first electrode layer so as to shield signal interference between the first electrode layer and a cathode layer of the OLED substrate.

11. The touch device of claim 10, wherein the conductive layer is bendable to conform flexibility of the flexible touch panel.

12. The touch device of claim 11, wherein the conductive layer is selected from a group composed of conductive polymer materials, carbon nanotubes, graphene, silver nanowires, metal mesh, and a combination thereof.

13. The touch device of claim 12, wherein a projection area of the conductive layer on the second electrode layer overlaps a projection area of the first electrode layer on the second electrode layer.

14. The touch device of claim 10, wherein the flexible touch panel further comprises a chip, the chip includes a first signal end for inputting the first voltage signal, and the conductive layer is electrically connected to the first signal end.

15. The touch device of claim 14, wherein the chip further includes a second signal end, the first electrode layer is electrically connected to the second signal end, the second signal end is utilized for inputting the second voltage signal, a value of the first voltage signal is greater than 0 and is smaller than or equal to a value of the second voltage signal.

16. The touch device of claim 15, wherein the flexible touch panel further comprises a non-touch area without touch control capability, the conductive layer includes a first bonding area, the first bonding area is in the non-touch area, and the first bonding area is electrically connected to the first signal end.

* * * * *